United States Patent
Tsai et al.

(10) Patent No.: US 12,261,172 B2
(45) Date of Patent: Mar. 25, 2025

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Ya-Yi Tsai, Hsinchu (TW); Shih-Yao Lin, New Taipei (TW); Chi-Hsiang Chang, Hsinchu (TW); Wei-Han Chen, Hsinchu (TW); Shu-Yuan Ku, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 712 days.

(21) Appl. No.: 17/460,198

(22) Filed: Aug. 28, 2021

(65) Prior Publication Data

US 2023/0061323 A1    Mar. 2, 2023

(51) Int. Cl.
*H01L 27/088* (2006.01)
*H01L 21/8234* (2006.01)

(52) U.S. Cl.
CPC .. *H01L 27/0886* (2013.01); *H01L 21/823481* (2013.01); *H01L 21/823431* (2013.01)

(58) Field of Classification Search
CPC ......... H01L 27/0886; H01L 21/823431; H01L 21/823821; H01L 21/823481; H01L 21/823878; H01L 29/785
See application file for complete search history.

(56) References Cited

U.S. PATENT DOCUMENTS

| | | | |
|---|---|---|---|
| 2019/0067120 A1* | 2/2019 | Ching | H01L 21/823431 |
| 2019/0148373 A1* | 5/2019 | Shi | H01L 21/31144 257/401 |
| 2020/0357896 A1* | 11/2020 | Cheng | H01L 27/0886 |

* cited by examiner

*Primary Examiner* — Tuan A Hoang
(74) *Attorney, Agent, or Firm* — FOLEY & LARDNER LLP

(57) ABSTRACT

A method of fabricating a semiconductor device is described. A substrate is provided. A plurality of fins is formed extending from the substrate, the fins including a first group of active fins arranged in an active region, and including an inactive fin having at least a portion in an inactive region, the active fins separated by first trench regions between adjacent of the active regions, the inactive fin separated from its closest active fin by a second trench region, the second trench region having a greater width than that of a trench region of the first trench regions. A dummy fin is formed on the isolation dielectric in the second trench region, the dummy fin disposed between the first group of active fins and the inactive fin. A dummy gate is formed over the fins. The gate isolation structure is disposed between the dummy fin and the inactive fin and separates regions of the dummy gate.

20 Claims, 14 Drawing Sheets

SEMICONDUCTOR DEVICES AND METHODS OF MANUFACTURING THEREOF

BACKGROUND

This disclosure relates generally to a semiconductor device, and in some embodiments, to transistor devices that include providing a cut poly (CPO) structure that extends between a dummy fin and an inactive fin.

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, device performance (such as device performance degradation associated with various defects) and fabrication cost of field-effect transistors become more challenging when device sizes continue to decrease. Although methods for addressing such a challenge have been generally adequate, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
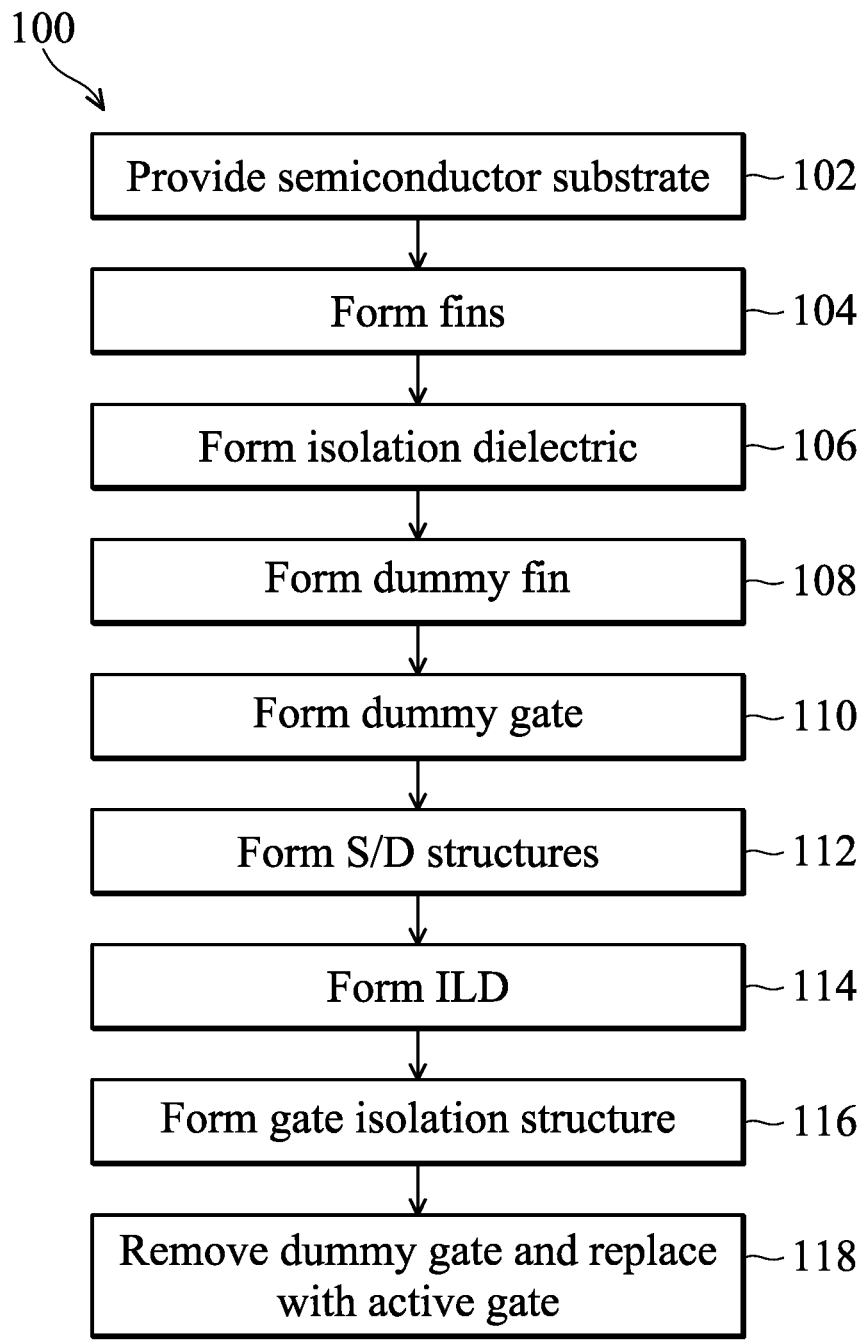
FIG. 1 illustrates a flow chart of an example method to make a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In contemporary semiconductor device fabrication processes, a large number of semiconductor devices, such as field effect transistors ("FETs"), are fabricated on a single wafer. Non-planar transistor device architectures, such as fin-based transistors (typically referred to as "FinFETs"), can provide increased device density and increased performance over planar transistors. Some advanced non-planar transistor device architectures, such as nanosheet (or nanowire) transistors, can further increase the performance over the FinFETs. When compared to the FinFET where the channel is partially wrapped (e.g., straddled) by a gate structure, the nanosheet transistor, in general, includes a gate structure that wraps around the full perimeter of one or more nanosheets for improved control of channel current flow. For example, in a FinFET and a nanosheet transistor with similar dimensions, the nanosheet transistor can present larger driving current ($I_{on}$), smaller subthreshold leakage current ($I_{off}$), etc. Such a transistor that has a gate structure fully wrapping around its channel is typically referred to as a gate-all-around (GAA) transistor of GAAFET.

The present disclosure provides various embodiments of a semiconductor device, which may include a FinFET, GAAFET, or nanosheet FET (NSFET) transistor.

Embodiments of the present disclosure are discussed in the context of forming a non-planar transistor, such as a FinFET, GAAFET, or NSFET transistor, and in particular, in the context of a method of fabricating a semiconductor device. A substrate is provided. A first opening is formed between a first active fin and a second active fin, and a second opening is formed between the first active fin and an inactive fin having at least an inactive portion in an inactive region, the second opening wider than the first opening. An isolation dielectric is formed on the substrate, the fins extending through the isolation dielectric. A dummy fin is formed on the isolation dielectric in the second opening. The dummy fin is disposed between the first active fin and the inactive fin. A dummy gate is formed over the first and second active fins and the inactive fin, the first and second active fins and the inactive fin extending into the dummy gate. A gate isolation structure is formed through the dummy gate and contacting the isolation dielectric. The gate isolation structure is disposed between the dummy fin and the inactive fin and separating regions of the dummy gate.

A semiconductor device formed by the above described method can advantageously reduce device size and yield, and provide a larger processing window (end cap window) for processes subsequent to formation of the gate isolation structure, or cut poly (CPO), in the dummy gate (dummy PO). Forming CPO on the dummy PO before metal gate fill shares the end cap window with the processes of dummy PO removal, metal refill, and MPG process. This process window is addressed by the gate isolation structure, i.e., (CPO) being disposed between the dummy fin and the inactive fin having at least an inactive portion in an inactive region. By disposing the CPO between the dummy fin and the inactive fin, instead of directly on the dummy fin, the CPO formation can provide a larger end cap window by disconnecting the CPO process variation from the end cap.

FIG. 1 illustrates a flowchart of a method 100 to form a non-planar transistor device, according to one or more embodiments of the present disclosure. For example, at least some of the operations (or steps) of the method 100 can be used to form a FinFET (or a GAA) transistor device. Further, the method 100 can be used to form a FinFET transistor (or GAA transistor) device in a respective conduction type such as, for example, an n-type transistor device or a p-type transistor device. The term "n-type," as used herein, may be referred to as the conduction type of a transistor having electrons as its conduction carriers, and the term "p-type," as used herein, may be referred to as the conduction type of a transistor having holes as its conduction carriers.

FIG. 1 illustrates a flowchart of a method 100 to form a semiconductor device according to one or more embodiments of the present disclosure. It is noted that the method 100 is merely an example, and is not intended to limit the present disclosure. In some embodiments, the semiconductor device includes, at least part of, a fin field-effect-transistor (FinFET), but can include any of various other transistors (e.g., a GAAFET, a nanosheet field-effect-transistor) while remaining within the scope of the present disclosure.

Referring to FIG. 1, the method 100 starts with operation 102 in which a semiconductor substrate is provided. The method 100 continues to operation 104 in which active and inactive fins are formed extending beyond a major surface of the semiconductor substrate. The method 100 continues to operation 106 in which an isolation dielectric is formed in the fins. The method 100 continues to operation 108 in which a dummy fin is formed. The method 100 continues to operation 110 in which a dummy gate is formed. The method 100 continues to operation 112 in which S/D structures are epitaxially formed. The method 100 continues to operation 114 in which an interlevel dielectric (ILD) is formed. The method 100 continues to operation 116 in which a gate isolation structure is formed through the dummy gate. The method 100 continues to operation 118 in which the dummy gates are removed and replaced with active gates.

In the following discussions, the operations of the method 100 may be associated with views of a semiconductor device 200 at various fabrication stages. In some embodiments, the semiconductor device 200 may be a FinFET. In other embodiments the semiconductor device 200 may be a GAAFET or nanosheet FET (NSFET).

Figure 2:
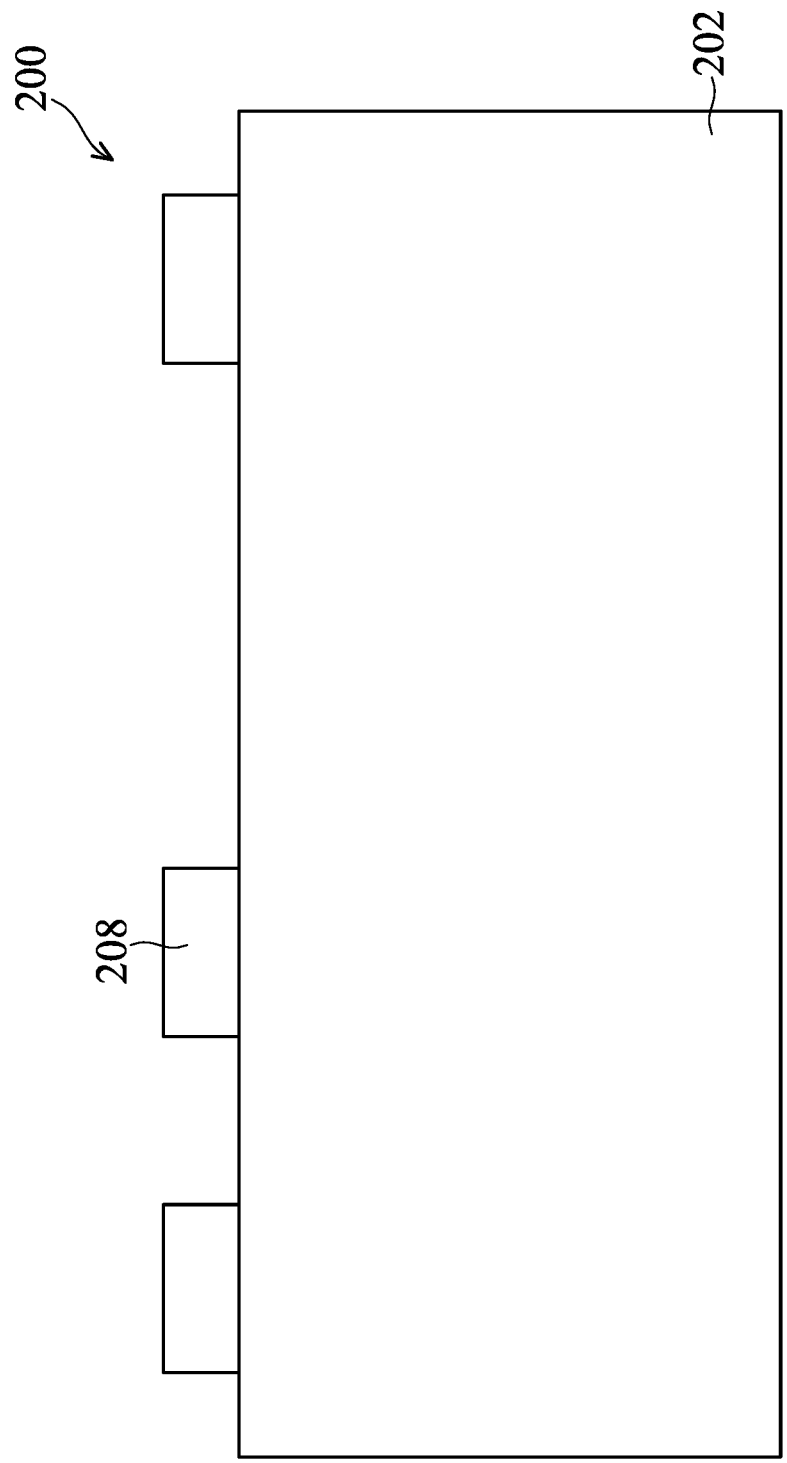
FIGS. 2-6, 9 and 10, illustrate cross-sectional views cut along a direction (X-X) with the gate.

Corresponding to operation 102 of FIG. 1, FIG. 2 is a view of the semiconductor device 200 including a substrate 202 at one of the various stages of fabrication, according to some embodiments. In some embodiments, the substrate 202 is covered by a photo-sensitive layer 208 and is patterned to subsequently form one or more fins of the semiconductor device, which will be discussed in the following operations.

For a FinFET structure, the substrate 202 may be a semiconductor substrate, such as a bulk semiconductor, a semiconductor-on-insulator (SOI) substrate, or the like, which may be doped (e.g., with a p-type or an n-type dopant) or undoped. The substrate 202 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 202 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 3:
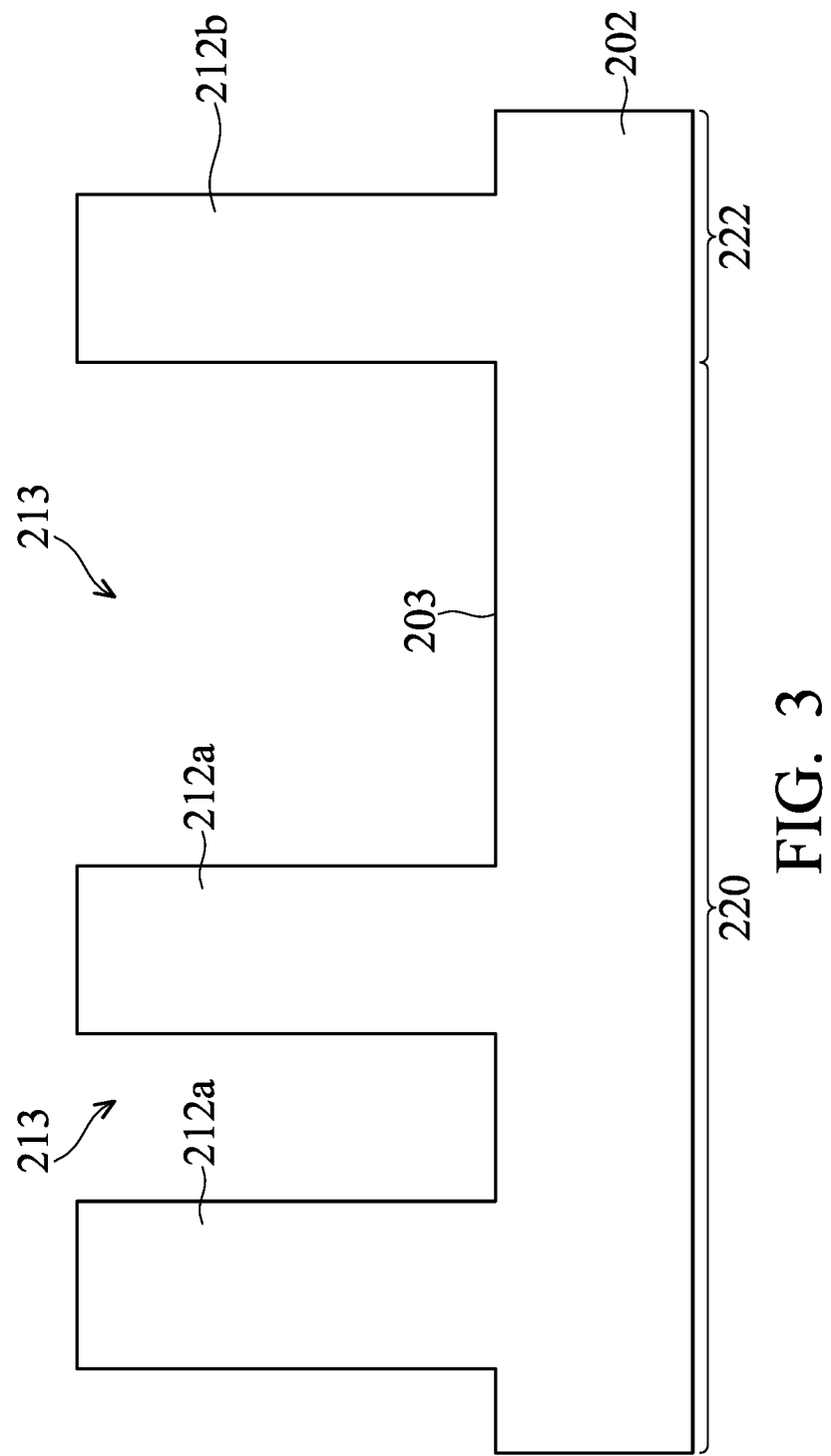

Corresponding to operation 104 of FIG. 1, FIG. 3 is a view of the semiconductor 200 including a plurality of fins 212 (i.e., 212a, 212b, . . . ) at one of the various stages of fabrication, according to some embodiments. As shown, trenches 213 are disposed between adjacent fins 212. It is noted that although three fins 212 are shown in the illustrated embodiments of FIG. 3 (and the following figures), any desired number of fins may be formed on the semiconductor substrate 202 using the photo-sensitive layer 208 (see FIG. 2) with a corresponding pattern. As such, when multiple fins are formed on the substrate 202 that are in parallel with one another, the fins can be spaced apart from one another by a corresponding trench 213.

The fins 212 may be formed by a photolithographic process, for example. The photo-sensitive layer 208 in FIG. 2 may be patterned in a photolithographic process, for example, and may be used as an etch mask to etch the substrate 202 to form fins 212 and trenches 213 between the fins 212, in the substrate 202. Portions of the semiconductor substrate 202 sandwiched between the trenches 213 are thus formed as fins 212. The fins 212 each extend upward from the surface 203. The trenches 213 may be strips (viewed from the top of the semiconductor device 200) parallel to each other, and closely spaced with respect to each other. After the fins 212 are formed, the photo-sensitive layer 208 (not shown in FIG. 3 for purposes of clarity) is removed. Subsequently, a cleaning process may be performed to remove a native oxide of the semiconductor substrate 202. The cleaning may be performed using diluted hydrofluoric (DHF) acid, or the like, for example.

The fins 212 are arranged in a first group of active fins 212a and an inactive fin 212b. The first group of active fins 212a are arranged in an active region 220, while the inactive fin 212b is arranged to have at least an inactive portion in an inactive region 222. The inactive fin 212b having at least a portion arranged in the inactive region 222 may correspond to the polysilicon diffusion edge (PODE) region (where there is dummy gate poly (PO) at the FIN edge). The inactive fin 212b may also have a portion which is active. The first group of active fins 212a arranged in an active region 220 may correspond to a Non-PODE region. The reference character 212 refers to a fin generically, while the reference characters 212a and 212b refer to an active fin and inactive fin, respectively.

Figure 14:
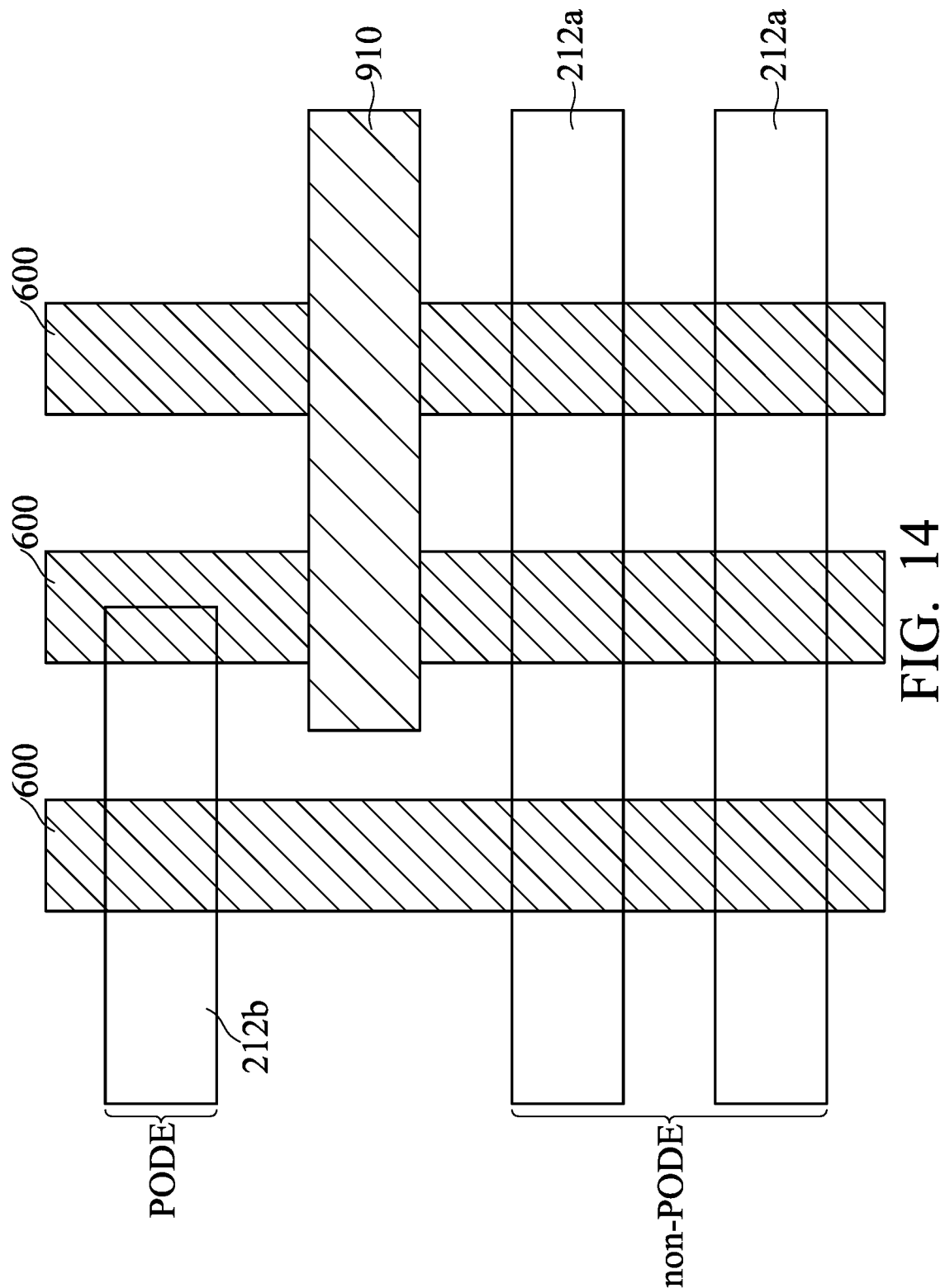
FIG. 14 is a schematic illustrating PODE and Non-PODE regions generally.

FIG. 14 is a schematic illustrating PODE and Non-PODE regions generally. The device includes an inactive fin 212b with at least a portion in the PODE region where the middle dummy gate 600 (PO) is on the edge of the inactive fin 212*b*. The portion of the inactive fin 212*b* crossing the left dummy gate 600 is still active. The device also includes active fins 212*a* in the Non-PODE region, which is at least partially separated from the PODE region by the gate isolation structure 910 (CPO).

Returning to FIG. 3, a width of the trench 213 disposed between the inactive fin 212*b* and the closest active fin 212*a* (the rightmost in FIG. 3), is greater than the trench 213 between adjacent of the active fins 212*a*. This is so that a subsequently formed dummy fin may more easily be formed in the trench 213 adjacent the inactive fin 212*b*. The wider trench 213 may be formed by patterning a wider trench adjacent the inactive fin 212*b* for the formation of the fins 212, or by forming an active fin 212*a* adjacent the inactive fin 212*b*, and removing the adjacent active fin 212*a*. The formation of the wider trench 213 may be formed using photolithographic techniques.

Figure 4:
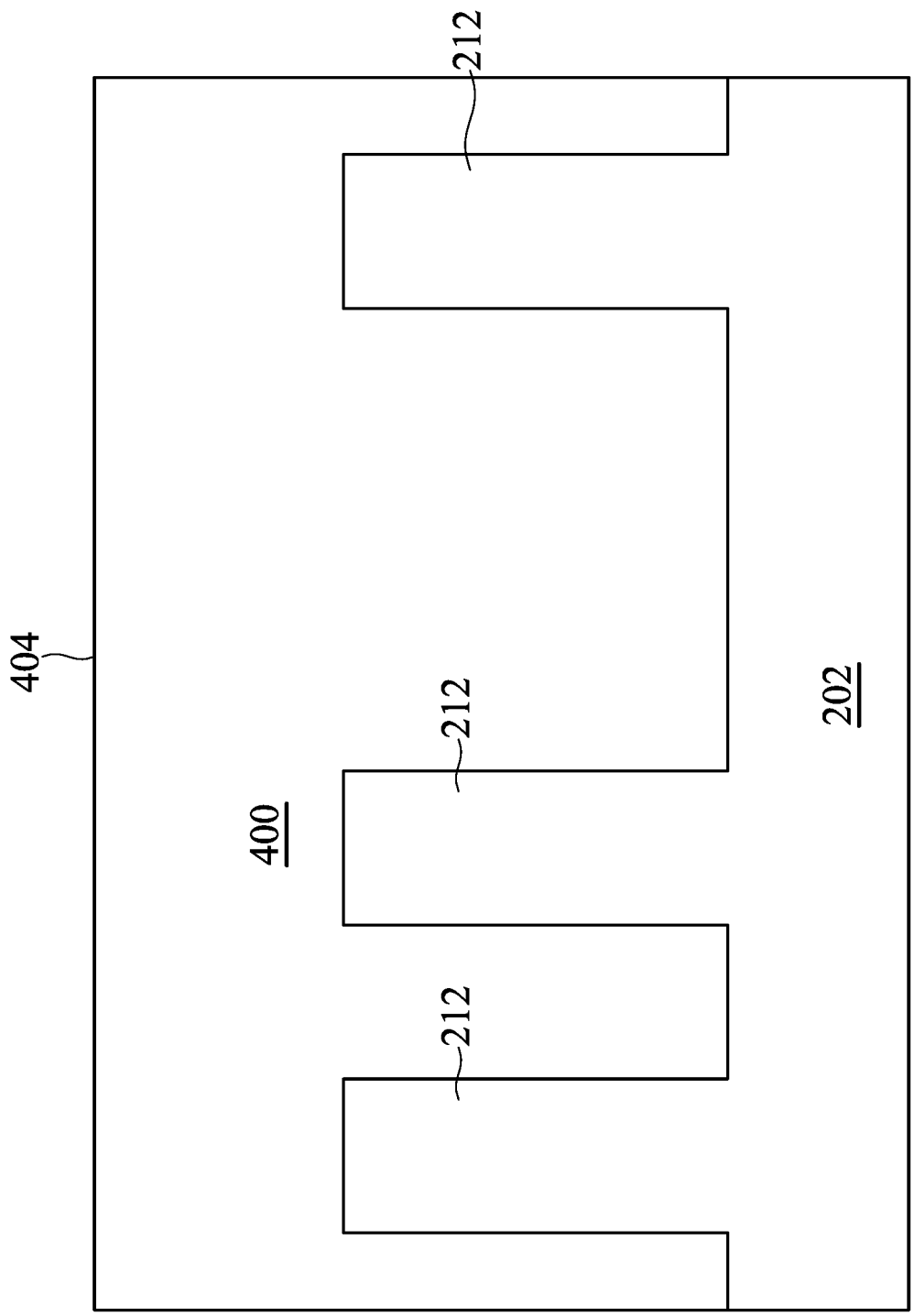

Corresponding to operation 106 of FIG. 1, FIG. 4 is a view of the semiconductor 200 including isolation regions 400 at one of the various stages of fabrication, according to some embodiments. The isolation regions 400, which are formed of an insulation material, such as an isolation dielectric, can electrically isolate neighboring fins from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 400 and a top surface of the fins 212 that are coplanar (not shown).

In some embodiments, the isolation regions 400 include a liner, e.g., a liner oxide (not shown), at the interface between each of the isolation regions 400 and the substrate 202 (fins 212). In some embodiments, the liner oxide is formed to reduce crystalline defects at the interface between the substrate 202 and the isolation region 400. Similarly, the liner oxide may also be used to reduce crystalline defects at the interface between the fins 212 and the isolation region 400. The liner oxide (e.g., silicon oxide) may be a thermal oxide formed through a thermal oxidation of a surface layer of the substrate 202, although other suitable methods may also be used to form the liner oxide.

Figure 5:
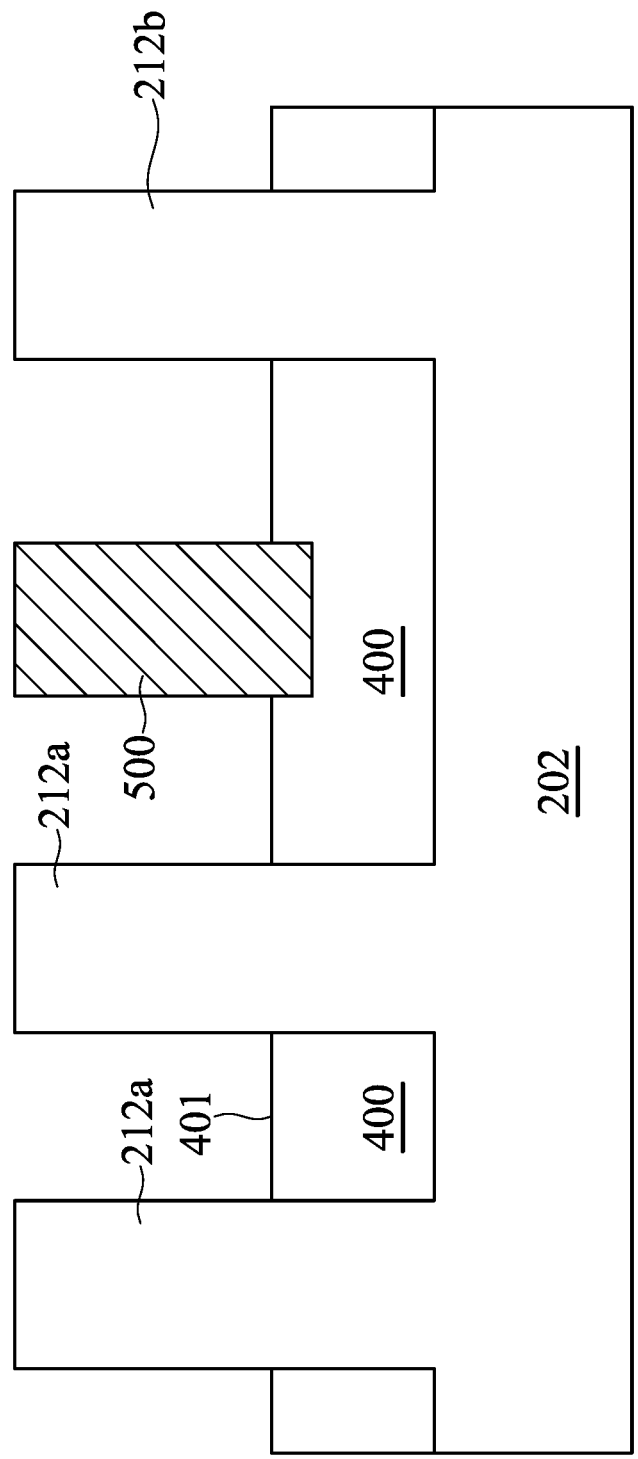

Corresponding to the operation 108 of FIG. 1, FIG. 5 illustrates a view of the semiconductor device 200 including a dummy fin 500 at one of the various stages of fabrication, according to some embodiments. The dummy fin 500 may be formed in the isolation region 400 between the active fins 212*a* and the inactive fin 212*b*. The dummy fin 500 may be formed in a recess in the isolation region 400 before the overall isolation region 400 is recessed to expose upper regions of the active fins 212*a* and the inactive fin 212*b* in formation of the STI regions. The recess may be formed by a photolithographic method including etching to form the recess. For example, the photolithographic method may include a dry etch or a wet etch using dilute hydrofluoric (DHF) acid to form the recess. The height of the dummy fin 500 may be less than, the same, or greater than the height of the fins 212.

The dummy fin 500 may be formed of a dummy fin material which is deposited in the recess 510, where excess dummy fin material is then removed such as by etching or polishing. The dummy film material may be a dielectric material, for example. The dummy fin material may include a material selected from the group consisting of silicon oxide, silicon nitride, silicon carbide, silicon oxycarbide, silicon oxynitride, silicon carbonitride, silicon oxycarbonitride, and combinations thereof. The dummy fin material may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. In some other embodiments, the dummy fin material may include a high-k dielectric material. As such, the dummy fin material may have a k value greater than about 4.0 or even greater than about 7.0, and may include a metal oxide or a silicate of Hf, Al, Zr, La, Mg, Ba, Ti, Pb, and combinations thereof. The dummy fin material may be TaN, TaO, or HfO, for example. The formation methods of such a high-k dummy fin material may include CVD molecular beam deposition (MBD), atomic layer deposition (ALD), PECVD, and the like. Excess dummy fin material is then removed such as by etching back or polishing.

Next, the isolation regions 400 are recessed to form shallow trench isolation (STI) regions 400, as shown in FIG. 5. The isolation regions 400 are recessed such that the upper portion of the fins 212 protrude from between neighboring STI regions 400. In other words, the fins 212 are protruded from a top surface 401 of the STI regions 400. The top surface 401 of the STI regions 400 may have a flat surface (as illustrated), a convex surface, a concave surface (such as dishing), or combinations thereof. The top surface 401 of the STI regions 400 may be formed flat, convex, and/or concave by an appropriate etch. The isolation regions 400 may be recessed using an acceptable etching process, such as one that is selective to the material of the isolation regions 400. For example, a dry etch or a wet etch using dilute hydrofluoric (DHF) acid may be performed to recess the isolation regions 400.

Figure 6:
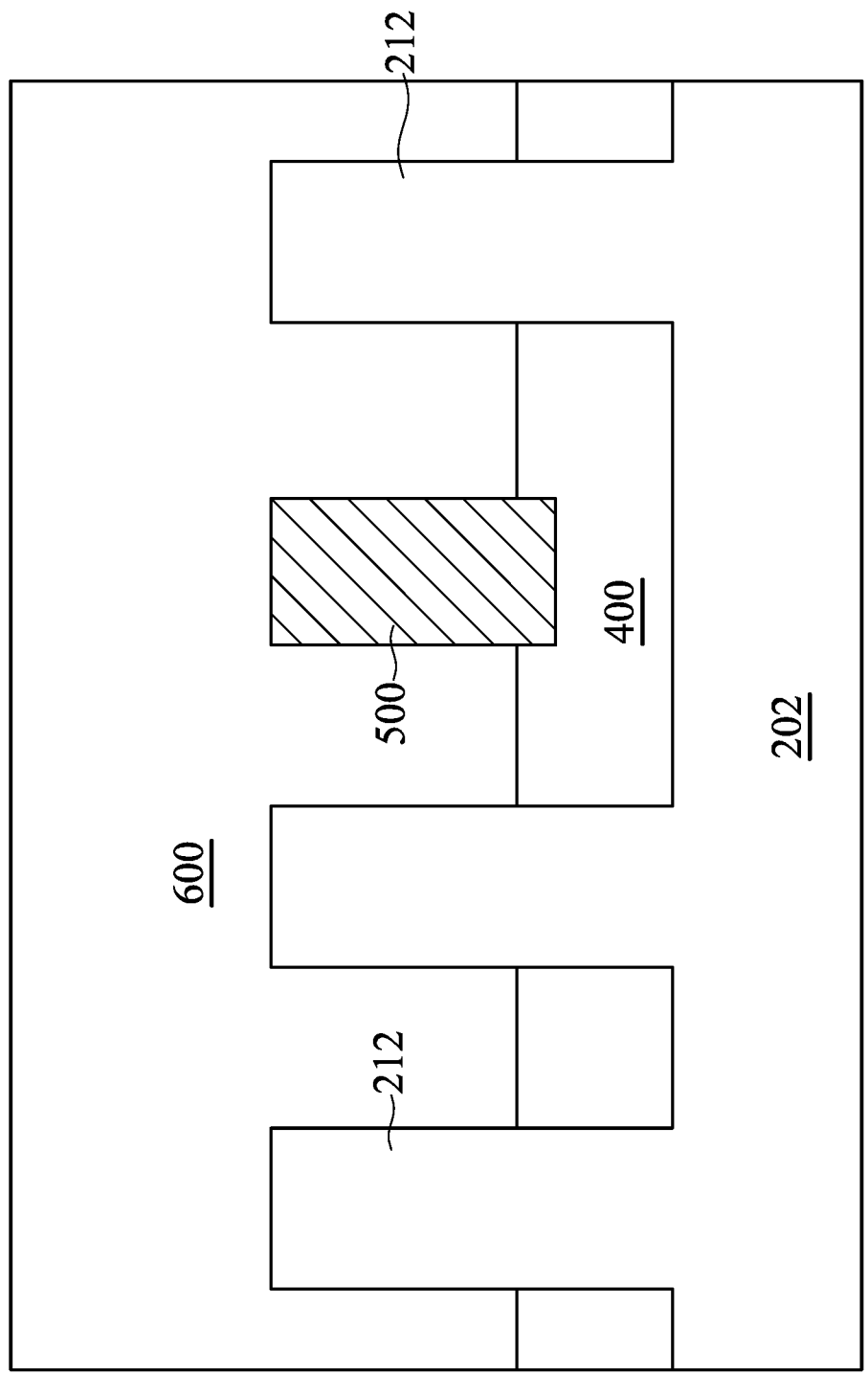

Corresponding to the operation 110 of FIG. 1, FIG. 6 illustrate views of the semiconductor device 200 including a dummy gate structure 600 at one of the various stages of fabrication, according to some embodiments The dummy gate structure 600 may be formed from a gate layer formed over the fins 212 and then planarized, such as by a CMP. A mask layer may be deposited over the gate layer. The gate layer may be formed of, for example, polysilicon, although other materials may also be used. The mask layer may be formed of, for example, silicon nitride or the like. After the layers (e.g., the gate layer, and the mask layer) are formed, the mask layer may be patterned using acceptable photolithography and etching techniques to form a mask. The pattern of the mask then may be transferred to the gate layer by an acceptable etching technique to form the dummy gate structure 600. The patterned dummy gate structure 600 has regions exposing each of the fins 212 for subsequent S/D structure formation.

Figure 7:
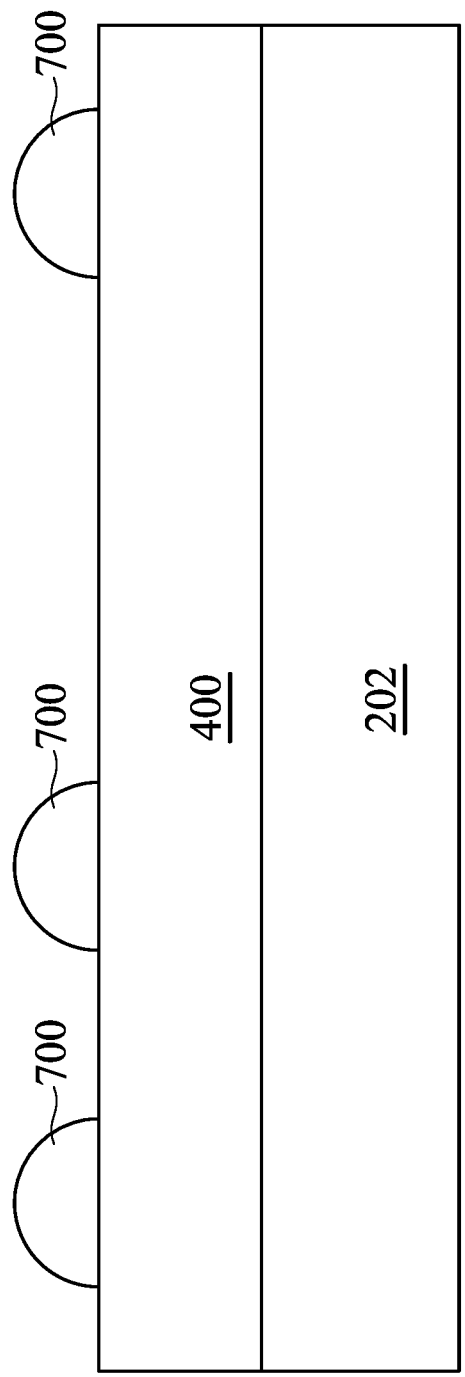
FIGS. 7 and 8, illustrate cross-sectional views cut along a direction (X'-X'), with the source/drain (S/D) i.e, without the gate of a semiconductor device, made by the method of FIG. 1, during various fabrication stages in accordance with some embodiments.

Corresponding to the operation 112 of FIG. 1, FIG. 7 is a view of the semiconductor device 200 in which S/D structures are epitaxially formed. The cross sectional view of FIG. 7 is cut within the S/D structures, and is a cross sectional view (along X-X) parallel to that of FIG. 6, which is cut within the dummy gate structure 600.

The source/drain regions 700 are formed by epitaxially growing a semiconductor material from the exposed portions of the fins 212. Various suitable methods can be used to epitaxially grow the S/D structures 700 such as, for example, metal-organic CVD (MOCVD), molecular beam epitaxy (MBE), liquid phase epitaxy (LPE), vapor phase epitaxy (VPE), selective epitaxial growth (SEG), the like, or combinations thereof.

In some embodiments, when the resulting semiconductor device 200 is an n-type FinFET, the source/drain structures 700 may include silicon carbide (SiC), silicon phosphorous (SiP), phosphorous-doped silicon carbon (SiCP), or the like. When the resulting FinFET 200 is a p-type FinFET, the source/drain structures 700 may include SiGe, and a p-type impurity such as boron or indium.

The S/D structures 700 may be implanted with dopants to form the S/D structures 700, followed by an anneal process. The implanting process may include forming and patterning masks such as a photoresist to cover the regions of the FinFET 200 that are to be protected from the implanting process. The S/D structures 700 may have an impurity (e.g., dopant) concentration in a range from about $1 \times 10^{19}$ cm$^{-3}$ to about $1 \times 10^{21}$ cm$^{-3}$. P-type impurities, such as boron or indium, may be implanted in the S/D structures 700 of a P-type transistor. N-type impurities, such as phosphorous or arsenide, may be implanted in the S/D structures 700 of an N-type transistor. In some embodiments, the epitaxial S/D structures 700 may be in situ doped during growth.

Figure 8:
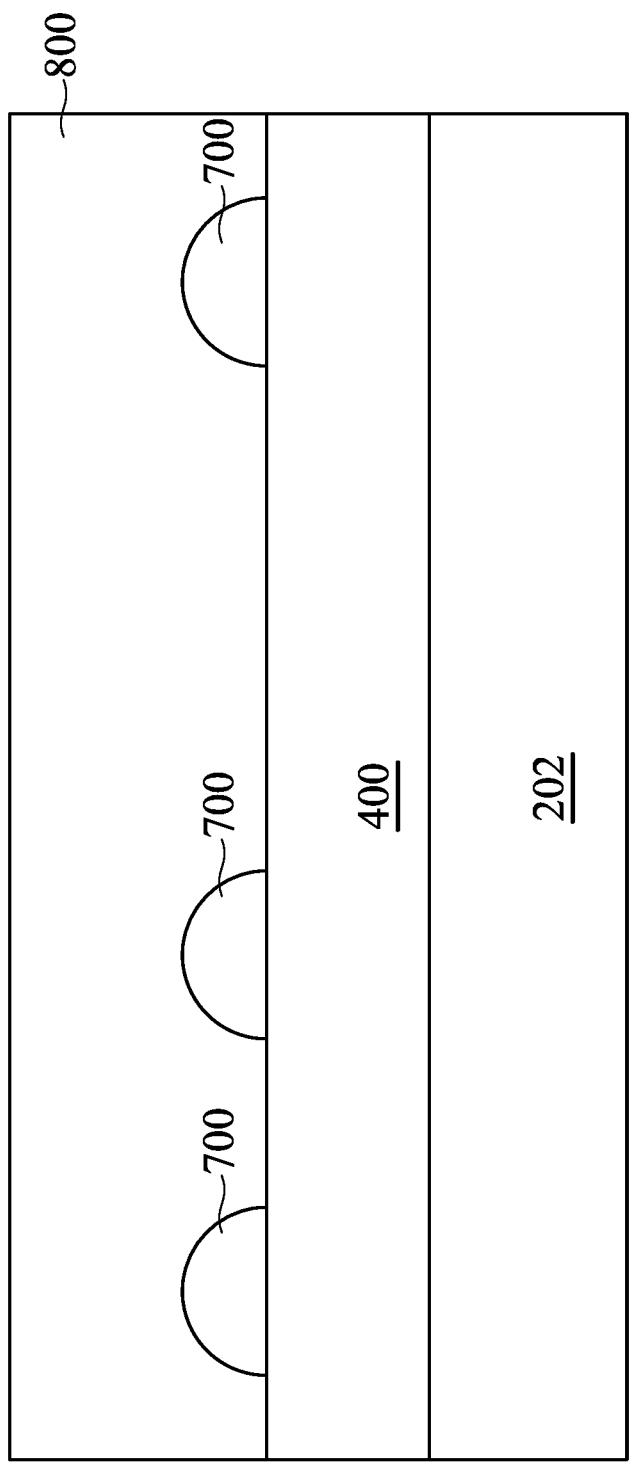

Corresponding to the operation 114 of FIG. 1, FIG. 8 is a view of the semiconductor device 200 in which an ILD 800 is formed at one of the various stages of fabrication, according to some embodiments. FIG. 8 illustrates a cross sectional view which is cut within the S/D structures 700 in a similar fashion to FIG. 7. The ILD 800 is formed over the fins 212 and the S/D structures 700, and is formed in holes in the dummy gate structure 600. The ILD 800 may be formed over an etch stop layer (CESL) (not shown). In some embodiments, the ILD 800 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 800 is formed, a planarization process, such as a CMP process, may be performed to achieve a level upper surface for the ILD 800. After the planarization process, the upper surface of the ILD 800 can be level with the upper surface of the dummy gate structure 600, in some embodiments.

Figure 9:
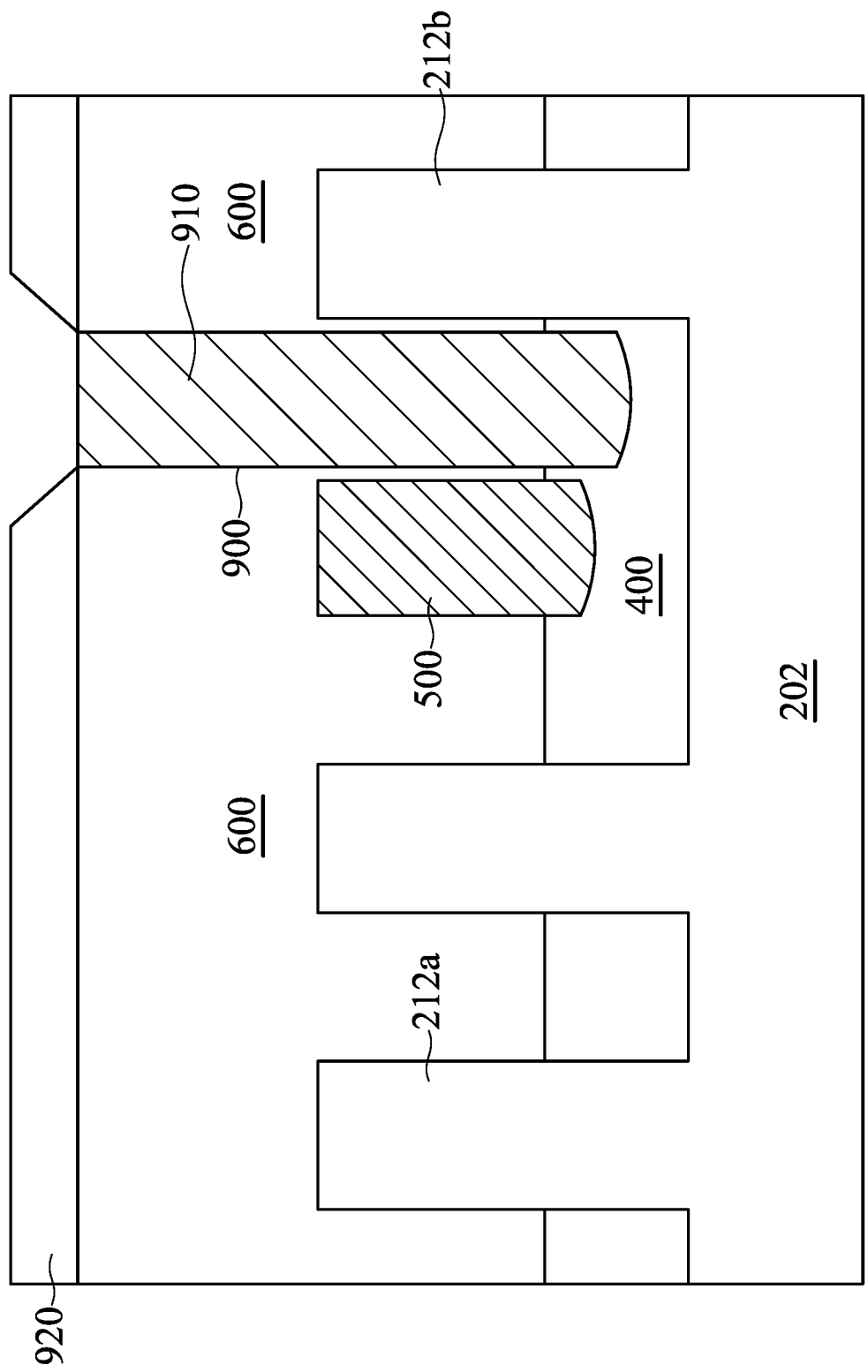

Corresponding to the operation 116 of FIG. 1, FIG. 9 is a view of the semiconductor device 200 in which a gate isolation structure is formed through the dummy gate 600 at one of the various stages of fabrication, according to some embodiments. FIG. 9 illustrates a cross sectional view which is cut within the gate structures.

A hard mask 920 may be formed on the dummy gate 600. The hard mask 920 may be formed of, for example, a dielectric, such as silicon nitride. The hard mask 920 may be formed using photolithographic techniques, including etching. The hard mask 920 is formed to expose an upper surface of the dummy gate 600 above the region between the dummy fin 500 and the inactive fin 212b.

The dummy gate 600 is then etched using the hard mask 920 as an etch mask. The dummy gate 600 may be etched by an appropriate etchant, and may be etched using RIE, for example. The dummy gate 600 is etched to form a hole 900 extending from a top surface of the dummy gate 600 to the isolation dielectric 400. The hole 900 is disposed between the dummy fin 500 and the inactive fin 212b and separates regions, for example active region 220 and in-active region 222 of FIG. 3, of the dummy gate 600.

A dielectric material is formed in the hole 900 to form a gate isolation structure 910 in the hole 900. The dielectric material may be, for example, silicon oxide, silicon nitride, silicon oxynitride, silicon carbide, silicon carbonitride, silicon oxycarbonitride, silicon oxycarbide, multilayers thereof, or the like. The gate isolation structure 910 can be formed by depositing the dielectric material in the hole 900 using any suitable method, such as CVD, PECVD, or FCVD.

After forming the gate isolation structure 910, the hard mask 920 may be removed by an appropriate etchant or polishing. The gate isolation structure 910 may extend to a top surface of the dummy gate 600.

Figure 10:
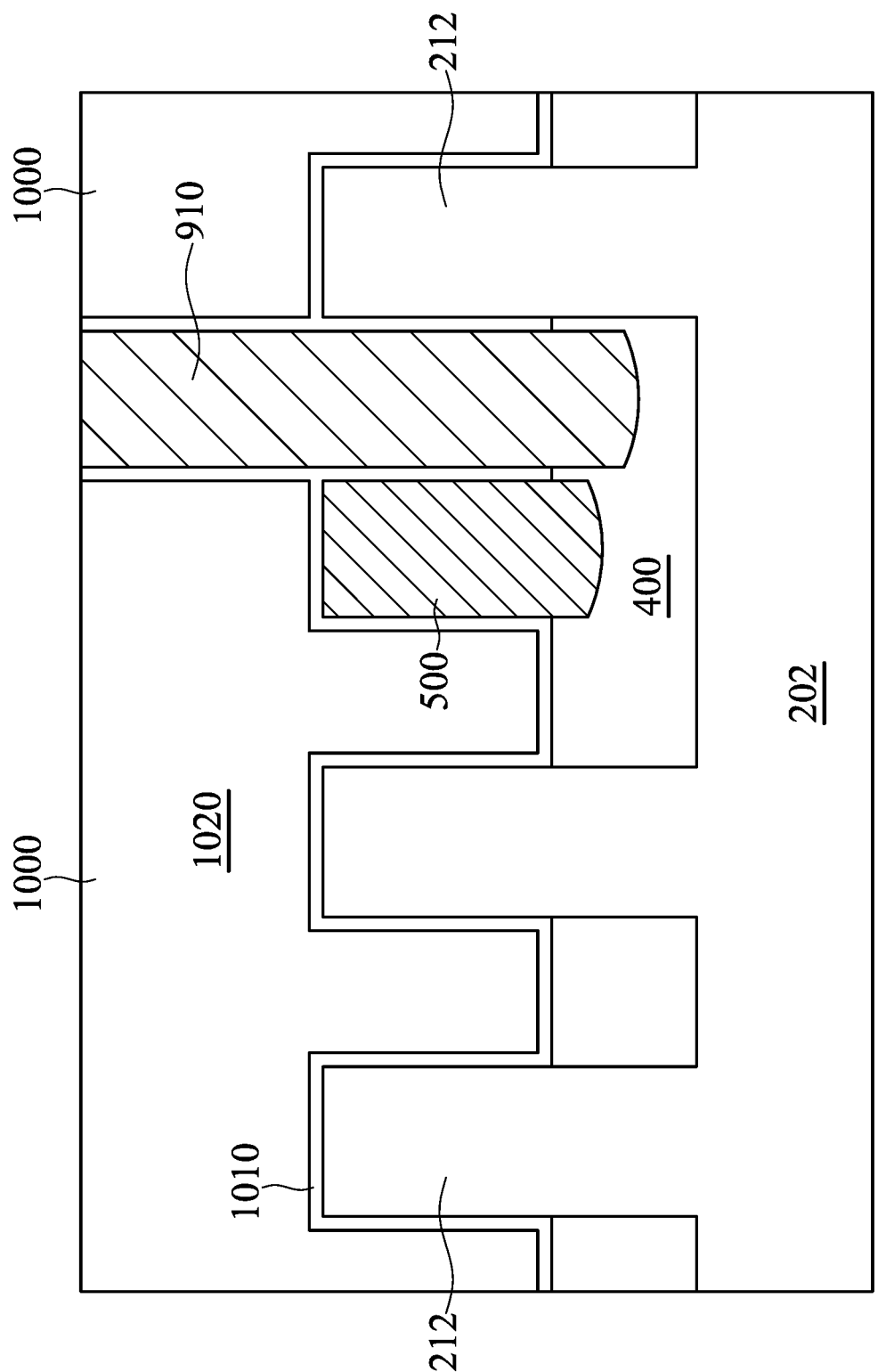

Corresponding to the operation 118 of FIG. 1, FIG. 10 is a view of the semiconductor device 200 in which the dummy gate structures 600 are removed and replaced with conducting gates 1000. The dummy gate structures 500 may be removed, for example, by an appropriate etch. For example, one or more isotropic etching processes may be performed.

The conducting gates 1000 may include a gate dielectric 1010 and a gate electrode 1020. The central portions of the fins 212 are overlaid by the conductive gate electrode 1020 with the gate dielectric layer 1010 sandwiched therebetween. The gate dielectric layer 1010 may include a high-k dielectric material (e.g., with a k value greater than about 4.0 or even greater than about 7.0). In such embodiments, the high-k dielectric layer 1010 may include a material selected from: $Al_2O_3$, HfAlO, HfAlON, AlZrO, $HfO_2$, $HfSiO_x$, HfAlO$_x$, HfZrSiO$_x$, HfSiON, $LaAlO_3$, $ZrO_2$, or combinations thereof. The high-k dielectric layer 1010 may be formed using a suitable process such as ALD, CVD, PVD, plating, or combinations thereof. The gate electrode 1020 may include a metal material such as, for example, Al, Cu, W, Ti, Ta, TiN, TiAl, TiAlN, TaN, NiSi, CoSi, or combinations thereof. In some other embodiments, the gate electrode 1020 may include a polysilicon material. The polysilicon material may be doped with a uniform or non-uniform doping concentration. The gate electrode 1020 may be formed using a suitable process such as ALD, CVD, PVD, plating, or combinations thereof.

The gate electrode 1020 may include a stack of multiple metal materials. For example, the gate electrode 1020 may be a p-type work function layer, an n-type work function layer, multi-layers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), ALD, and/or other suitable process.

Figure 11:
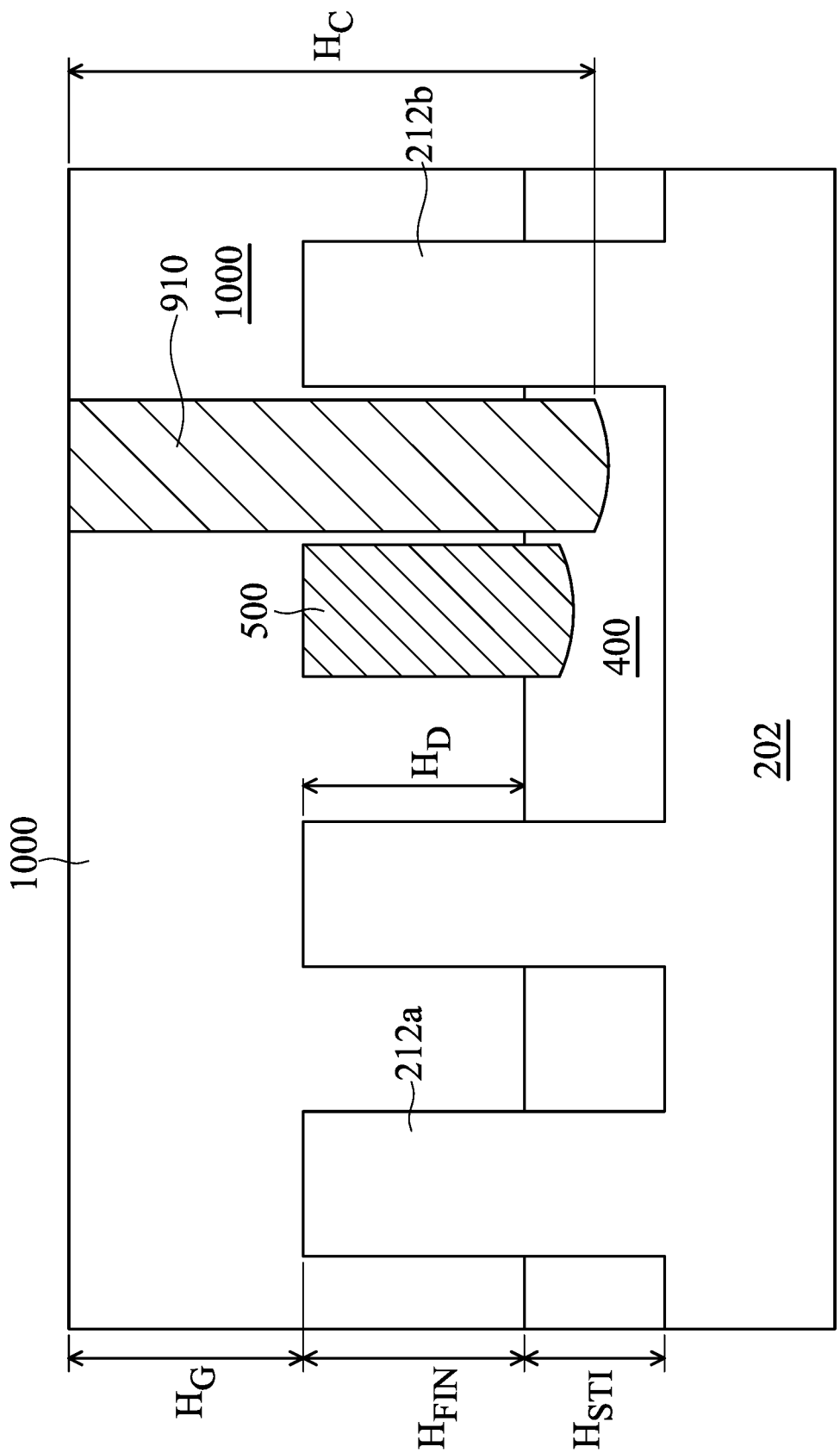
FIG. 11 is a cross section, similar to that of FIG. 10, illustrating the semiconductor device according to some embodiments illustrating some height relations.

FIG. 11 is a cross section illustrating the semiconductor device according to some embodiments illustrating some height relations. FIG. 11 illustrates the device 200 with substrate 202, conducting gate 1000, gate isolation structure

910, isolation regions 400, active fins 212a, inactive fin 212b, and dummy fin 500 in a similar manner to FIG. 10. Further FIG. 11 illustrates height Hc, which is a height from a bottom surface (bottom of bottom surface curve) of the gate isolation structure 910 to a top surface of the conducting gate 1000. $H_{FIN}$ is the height from the dielectric isolation 400 to a top surface of the active fins 212a. $H_G$ is height from the top surface of the active fins 212a to the top surface of the conducting gate 1000. Hc is greater than or equal to the sum of $H_{FIN}$ and $H_G$ in some embodiments. $H_D$ is the height from the dielectric isolation 400 to a top surface of the dummy fin 500. $H_{STI}$ is the height from the substrate 202 to a top surface 401 of the dielectric isolation 400. $H_G$, $H_{FIN}$, $H_{STI}$, and $H_D$ may be in the range of 5 to 200 nm, for example.

Figure 12:
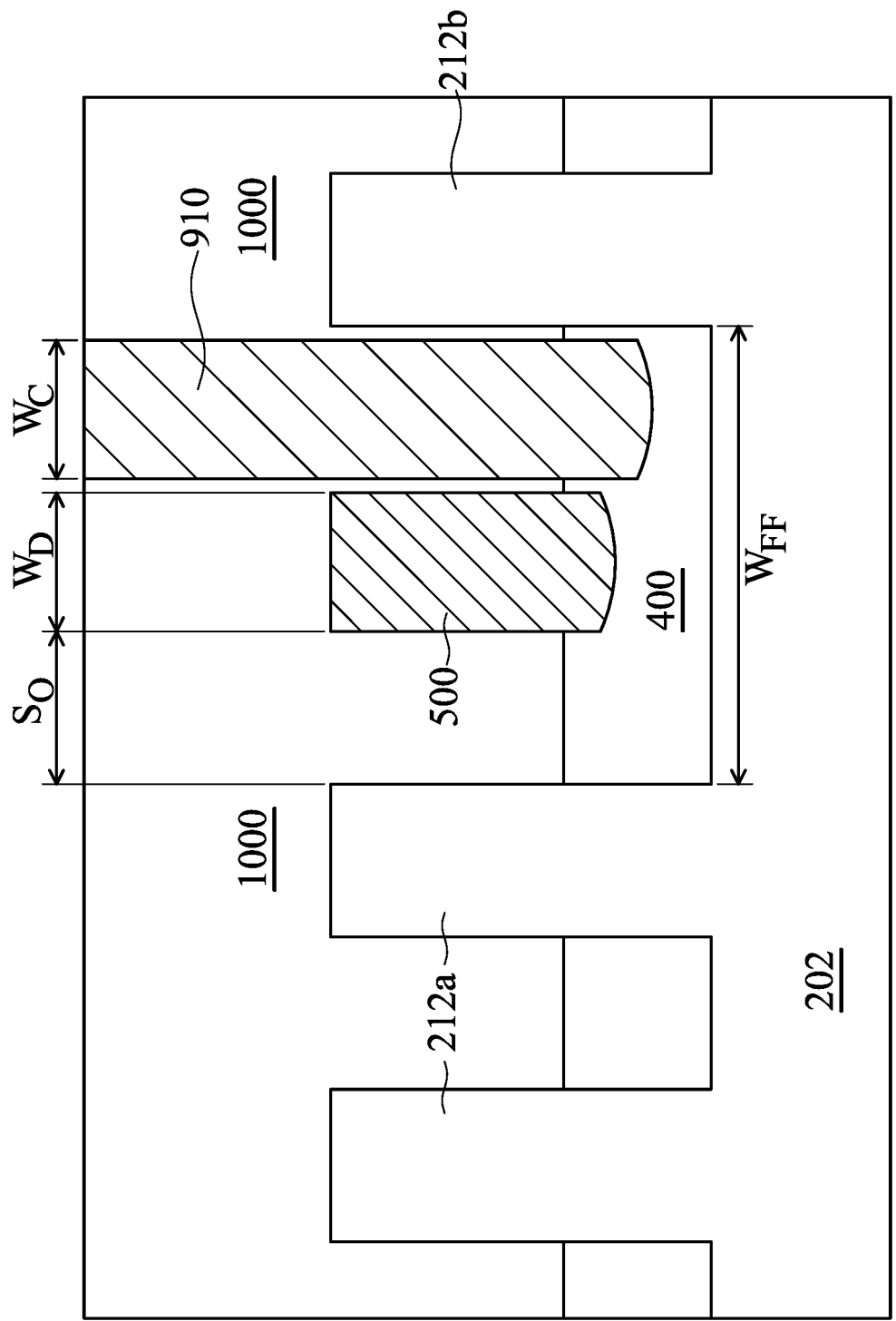
FIG. 12 is a cross section, similar to that of FIG. 10, illustrating the semiconductor device according to some embodiments illustrating some width relations.

FIG. 12 is a cross section illustrating the semiconductor device according to some embodiments illustrating some width relations. FIG. 12 illustrates the device 200 with substrate 202, conducting gate 1000, gate isolation structure 910, isolation regions 400, active fins 212a, inactive fin 212b, and dummy fin 500 in a similar manner to FIGS. 10 and 11. Further FIG. 12 illustrates width $W_D$ which is the width of the dummy fin 500. $W_C$ is the width of the gate isolation structure 910. $W_C$ may be greater than $W_D$ in some embodiments. $W_{FF}$ is the width from the inactive fin 212b to the closest active fin 212a. $W_C$ and $W_D$ may be in the range of 0.5 to 50 nm, for example.

$S_0$ is the minimum process space. The minimum process space is the minimum space needed to perform subsequent processes of the end cap window in the second trench region including dummy gate removal, active gate formation and MPG. S is the designed space between the closest active fin 212a and the gate isolation structure 910. ΔS is the process variation contribution from the gate isolation structure 910 process. These parameters have the relationship where S is greater than or equal to $S_0$ plus $W_D$. In some embodiments the gate isolation structure 910 may overlap some or all of the inactive fin 212b or dummy fin 500.

Further, $W_{FF}$, in some embodiments, may have the relationship where $W_{FF}$ is greater than or equal to the sum of twice $S_0$ plus $W_D$. Thus, disposing the gate isolation structure 910 between the dummy fin and the inactive fin 212b allows for a reduced $W_{FF}$, as compared to the case where the gate isolation structure 910 is formed to be disposed on the dummy fin 500.

Figure 13:
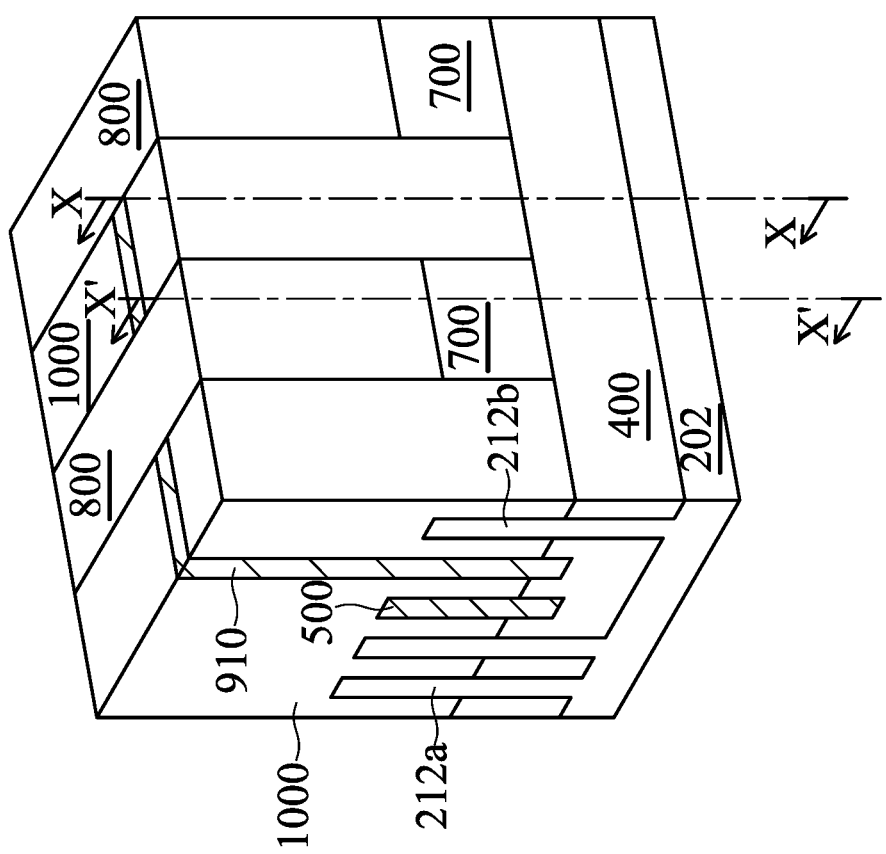
FIG. 13 is a perspective view illustrating the semiconductor device according to some embodiments.

FIG. 13 is a perspective view illustrating the semiconductor device illustrating the cross-sectional cuts within the gate 1000, and cross-sectional cuts outside the gate 1000. FIG. 13 illustrates the device 200 with S/D regions 700, ILD 800, substrate 202, conducting gate 1000, gate isolation structure 910, isolation regions 400, active fins 212a, inactive fin 212b, and dummy fin 500 in a similar manner to FIG. 10.

In one aspect of the present disclosure, a method of fabricating a semiconductor device is disclosed. A substrate is provided. A first opening is formed between a first active fin and a second active fin, and a second opening is formed between the first active fin and an inactive fin having at least an inactive portion in an inactive region, the second opening wider than the first opening. An isolation dielectric is formed on the substrate, the fins extending through the isolation dielectric. A dummy fin is formed on the isolation dielectric in the second opening. The dummy fin is disposed between the first active fin and the inactive fin. A dummy gate is formed over the first and second active fins and the inactive fin, the first and second active fins and the inactive fin extending into the dummy gate. A gate isolation structure is formed through the dummy gate and contacting the isolation dielectric. The gate isolation structure is disposed between the dummy fin and the inactive fin and separating regions of the dummy gate.

In another aspect of the present disclosure, a semiconductor device is disclosed. The semiconductor device includes a substrate. An isolation dielectric is disposed on the substrate and has a horizontal top surface. A plurality of fins extend from the substrate. The fins include a first group of active fins arranged in an active region, and include an inactive fin having at least an inactive portion in an inactive region. A dummy fin is disposed on the isolation dielectric and between the first group of active fins and the inactive fin. An active gate is disposed over the first group of active fins, but not the inactive fin, and contacts the isolation dielectric. A gate isolation structure extends through the active gate and contacts the isolation dielectric. The gate isolation structure is disposed between the dummy fin and the inactive fin and separates regions of the active gate. A width from the inactive fin to a closest of the active fins is greater than or equal to a sum of a width of the dummy fin and twice a minimum process space.

In another aspect of the present disclosure, a semiconductor device is disclosed. The semiconductor device includes a substrate. An isolation dielectric is disposed on the substrate and has a horizontal top surface. A plurality of fins extend from the substrate. The fins include a first group of active fins arranged in an active region, and include an inactive fin having at least an inactive portion in an inactive region. A dummy fin is disposed on the isolation dielectric and between the first group of active fins and the inactive fin. An active gate is disposed over the first group of active fins, but not the inactive fin, and contacts the isolation dielectric. A gate isolation structure extends through the active gate and contacts the isolation dielectric. The gate isolation structure is disposed between the dummy fin and the inactive fin separating regions of the active gate. A height from a bottom surface of the gate isolation structure to a top surface of the active gate is greater than or equal to the sum of the height from the isolation dielectric to a top surface of the first group of fins and the height from the top surface of the first group of fins to the top surface of the active gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   an isolation dielectric disposed on the substrate and having a horizontal top surface;
   a plurality of fins extending from the substrate, the fins including a first group of active fins arranged in an active region and an inactive fin having at least a portion in an inactive region;
   a dummy fin disposed on the isolation dielectric and between the first group of active fins and the inactive fin;

an active gate disposed over the first group of active fins, but not the inactive fin, and contacting the isolation dielectric; and a gate isolation structure extending adjacent to the active gate and contacting the isolation dielectric, the gate isolation structure disposed between the dummy fin and the inactive fin, and a bottom portion of the gate isolation structure extending into the isolation dielectric, wherein a distance from the inactive fin to a closest of the active fins is greater than or equal to a sum of a width of the dummy fin and twice a minimum process space.

2. The semiconductor device of claim 1, wherein the active gate comprises a gate dielectric and a gate electrode, the gate dielectric contacting the first group of active fins, the gate dielectric disposed between the first group of active fins and the gate electrode.

3. The semiconductor device of claim 1, wherein a width of the dummy fin is less than a width of the gate isolation structure.

4. The semiconductor device of claim 1, wherein the plurality of fins are formed of a same material as the substrate.

5. The semiconductor device of claim 1, wherein the dummy fin is formed of a dielectric material.

6. The semiconductor device of claim 1, wherein a height of the active fins is the same as a height of the dummy fin.

7. The semiconductor device of claim 1, wherein the active fins are formed of a semiconductor material.

8. A semiconductor device, comprising:

a substrate;

an isolation dielectric disposed on the substrate and having a horizontal top surface;

a plurality of fins extending from the substrate, the fins including a first group of active fins arranged in an active region and an inactive fin having at least a portion in an inactive region;

a dummy fin disposed on the isolation dielectric and between the first group of active fins and the inactive fin;

an active gate disposed over the first group of active fins, but not the inactive fin, and contacting the isolation dielectric, a portion of the active gate extending over a top surface of the dummy fin; and a gate isolation structure extending along a sidewall of the active gate and contacting the isolation dielectric, the gate isolation structure disposed between the dummy fin and the inactive fin, wherein a height from a bottom surface of the gate isolation structure to a top surface of the active gate is greater than or equal to a sum of a height from a top surface of the isolation dielectric to a top surface of the first group of fins and a height from the top surface of the first group of fins to the top surface of the active gate.

9. The semiconductor device of claim 8, wherein the active gate comprises a gate dielectric and a gate electrode, the gate dielectric contacting the first group of active fins, the gate dielectric disposed between the first group of active fins and the gate electrode.

10. The semiconductor device of claim 8, wherein a width of the dummy fin is less than a width of the gate isolation structure.

11. The semiconductor device of claim 8, wherein the plurality of fins are formed of a same material as the substrate.

12. The semiconductor device of claim 8, wherein the plurality of fins are formed of a same material.

13. The semiconductor device of claim 8, wherein a height of the active fins is the same as a height of the dummy fin.

14. The semiconductor device of claim 8, wherein the active fins are formed of a semiconductor material.

15. A semiconductor device, comprising:

a substrate;

an isolation dielectric disposed on the substrate and having a horizontal top surface;

a plurality of fins extending from the substrate, the fins including a first group of active fins arranged in an active region and an inactive fin having at least a portion in an inactive region;

a dummy fin disposed on the isolation dielectric and between the first group of active fins and the inactive fin;

an active gate disposed over the first group of active fins, but not the inactive fin, and contacting the isolation dielectric; and a gate isolation structure contacting a sidewall of the active gate and extending into the isolation dielectric, the gate isolation structure disposed between the dummy fin and the inactive fin, and an entirety of the gate isolation structure interposed between a sidewall of the dummy fin and a sidewall of the inactive fin, wherein a width of the dummy fin is less than a width of the gate isolation structure.

16. The semiconductor device of claim 15, wherein a height of the active fins is the same as a height of the dummy fin.

17. The semiconductor device of claim 15, wherein the active gate comprises a gate dielectric and a gate electrode, the gate dielectric contacting the first group of active fins, the gate dielectric disposed between the first group of active fins and the gate electrode.

18. The semiconductor device of claim 15, wherein the plurality of fins are formed of the same material as the substrate.

19. The semiconductor device of claim 15, wherein the dummy fin is formed of a dielectric material.

20. The semiconductor device of claim 15, wherein the active fins are formed of a semiconductor material.

* * * * *